US010641924B2

(12) United States Patent
Sampson et al.

(10) Patent No.: US 10,641,924 B2
(45) Date of Patent: May 5, 2020

(54) AUTOMATED TROPICAL STORM WIND RADII ANALYSIS AND FORECASTING

(71) Applicant: The Government of the United States of America, as represented by the Secretary of the Navy, Arlington, VA (US)

(72) Inventors: Charles R. Sampson, Aptos, CA (US); John Knaff, Fort Collins, CO (US); Michael D. Frost, Monterey, CA (US); Ann Schrader, Pacific Grove, CA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 146 days.

(21) Appl. No.: 15/697,531

(22) Filed: Sep. 7, 2017

(65) Prior Publication Data

US 2018/0081080 A1 Mar. 22, 2018

Related U.S. Application Data

(60) Provisional application No. 62/395,395, filed on Sep. 16, 2016.

(51) Int. Cl.
*G01W 1/10* (2006.01)
*G06Q 10/04* (2012.01)
*G06F 30/00* (2020.01)

(52) U.S. Cl.
CPC ............ *G01W 1/10* (2013.01); *G06F 30/00* (2020.01); *G06Q 10/04* (2013.01)

(58) Field of Classification Search
CPC ........................................................ G01W 1/10
See application file for complete search history.

(56) References Cited

U.S. PATENT DOCUMENTS

| | | | | |
|---|---|---|---|---|
| 8,160,995 B1* | 4/2012 | Crawford | ............... | G01W 1/10 702/2 |
| 8,204,846 B1* | 6/2012 | Crawford | ............... | G06N 7/005 706/62 |
| 8,224,768 B1* | 7/2012 | Crawford | ............... | G01W 1/10 702/2 |
| 2007/0221743 A1* | 9/2007 | Weinzapfel | ............ | A01G 15/00 239/14.1 |
| 2007/0223841 A1* | 9/2007 | Weinzapfel | ............ | G01W 1/06 382/325 |
| 2007/0225915 A1* | 9/2007 | Weinzapfel | ............ | G01W 1/02 702/3 |
| 2009/0240352 A1* | 9/2009 | Powell | ................... | G01W 1/10 700/89 |
| 2017/0300840 A1* | 10/2017 | Rainey | ................... | G06Q 50/26 |

OTHER PUBLICATIONS

Charles R. Sampson and Ann J. Schrader, "The Automated Tropical Cyclone Forecasting System (Version 3.2)," Bulletin of the American Meteorological Society, vol. 81, No. 6, Jun. 2000, pp. 1231-1240.

* cited by examiner

*Primary Examiner* — Raymond L Nimox
(74) *Attorney, Agent, or Firm* — US Naval Research Laboratory; Joslyn Barritt (57) ABSTRACT

A computer-implemented system and methods that simplifies and improves the process for generating wind radii in tropical cyclones.

3 Claims, 8 Drawing Sheets

AUTOMATED TROPICAL STORM WIND RADII ANALYSIS AND FORECASTING

CROSS-REFERENCE

This Application is a Nonprovisional of and claims the benefit of priority under 35 U.S.C. § 119 based on U.S. Provisional Patent Application No. 62/395,395 filed on Sep. 16, 2016. The Provisional Application and all references cited herein are hereby incorporated by reference into the present disclosure in their entirety.

TECHNICAL FIELD

The present invention relates to forecasting and analysis of tropical cyclone phenomena, particularly to forecasting and analysis of tropical cyclone wind radii.

BACKGROUND

The National Hurricane Center, uses the term "tropical cyclone" or "TC" as a generic term for a non-frontal synoptic-scale (i.e., on the order of 1000 km) low-pressure system over tropical or sub-tropical waters, where the system exhibits organized convection (i.e. thunderstorm activity) and definite cyclonic surface wind circulation.

Intense tropical cyclones can wreak havoc on coastal areas, destroying property and threatening life. Even if such storms do not make landfall, tropical cyclones create significant problems for both military and commercial maritime activities, often requiring these activities to make expensive and time-consuming changes to their operations.

Accurate forecasts of the track, intensity and size of tropical cyclones is thus critical for operations planning and for avoiding damages and loss of life.

Together, the U.S. TC Forecast Centers (the Joint Typhoon Warning Center, National Hurricane Center, and Central Pacific Hurricane Center) perform analysis and forecasting of TCs around the clock and for the entire globe for U.S. assets and allies. This analysis and forecasting are performed at a set series of times based on the universal time coordinate (UTC) standard, and are currently performed at UTC 00:00, 06:00, 12:00, and 18:00.

The analysis and forecast process at the U.S. TC Forecast Centers includes a series of steps that define and predict several descriptive parameters for each TC. A large portion of that process is in defining and predicting the TC "wind radii," i.e., the maximum distance from the TC center that winds of a certain level extend. At the U.S. TC Forecast Centers, the wind radii are defined for 34-knot (kt), 50-kt, and 64-kt thresholds. These levels are chosen because they correspond to gale force (34 kt), damaging (50 kt), and typhoon/hurricane force (64 kt) winds. These wind radii are further broken up into compass-based quadrants (NE, SE, SW, and NW) since each TC has its own frequently non-symmetric structure, causing the wind radii to be different in each of these four quadrants.

Analysis of wind radii is performed using an analytical framework often referred to in the art as the "objective track" or "OBTK," while the wind radii forecast is performed using an analytical framework often referred to in the art as the "wind radii consensus" or "RVCN."

These wind radii are critical to the forecast in that they provide a measure of the severity and geographic extent of the TC.

Figure 1A:
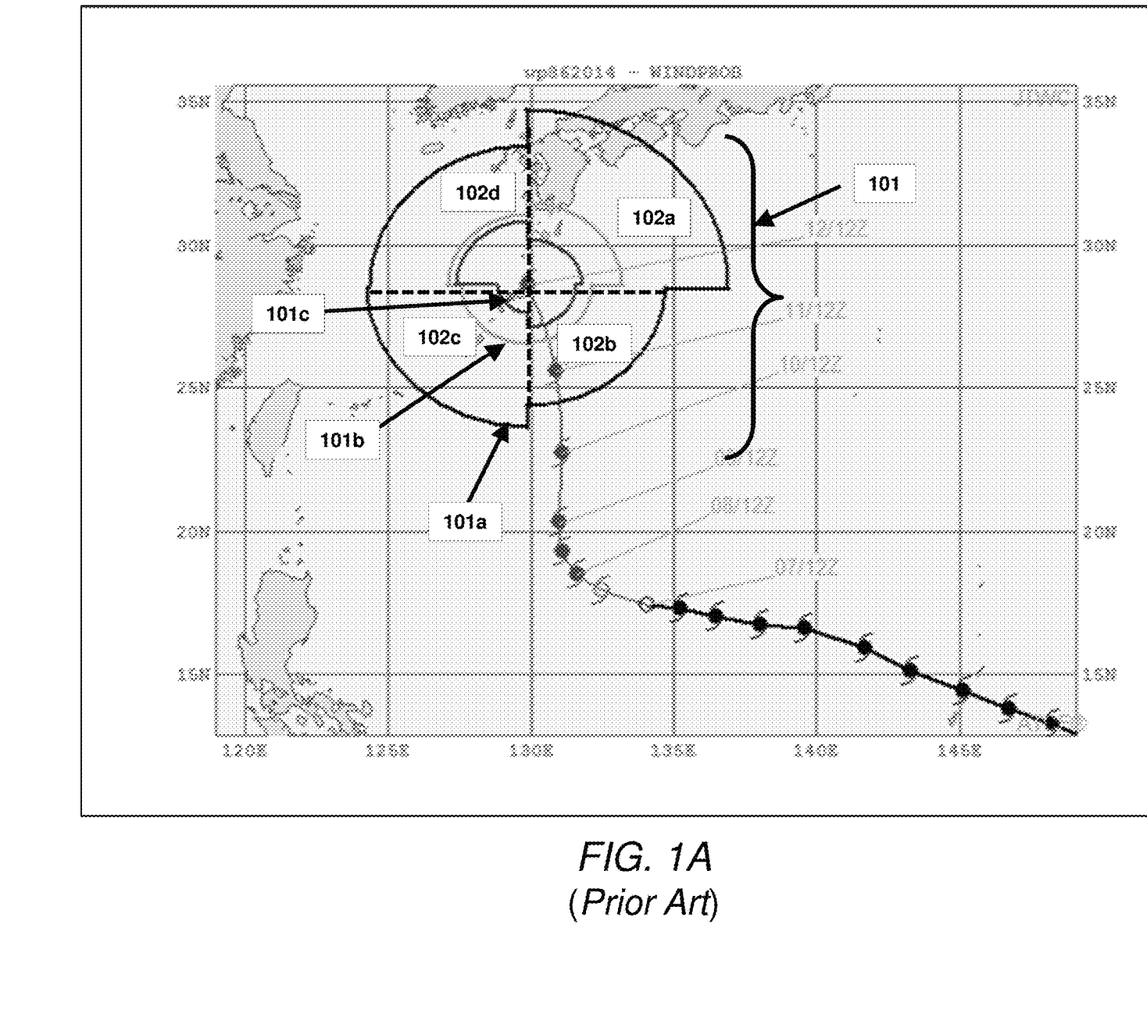
FIGS. 1A and 1B depict an exemplary wind radii plots showing estimated and forecast radii for winds at 34 kt, 50 kt, and 64 kt in four spatial compass quadrants for a single analysis time period (FIG. 1A) and over several forecast time periods (FIG. 1B).
Figure 1B:
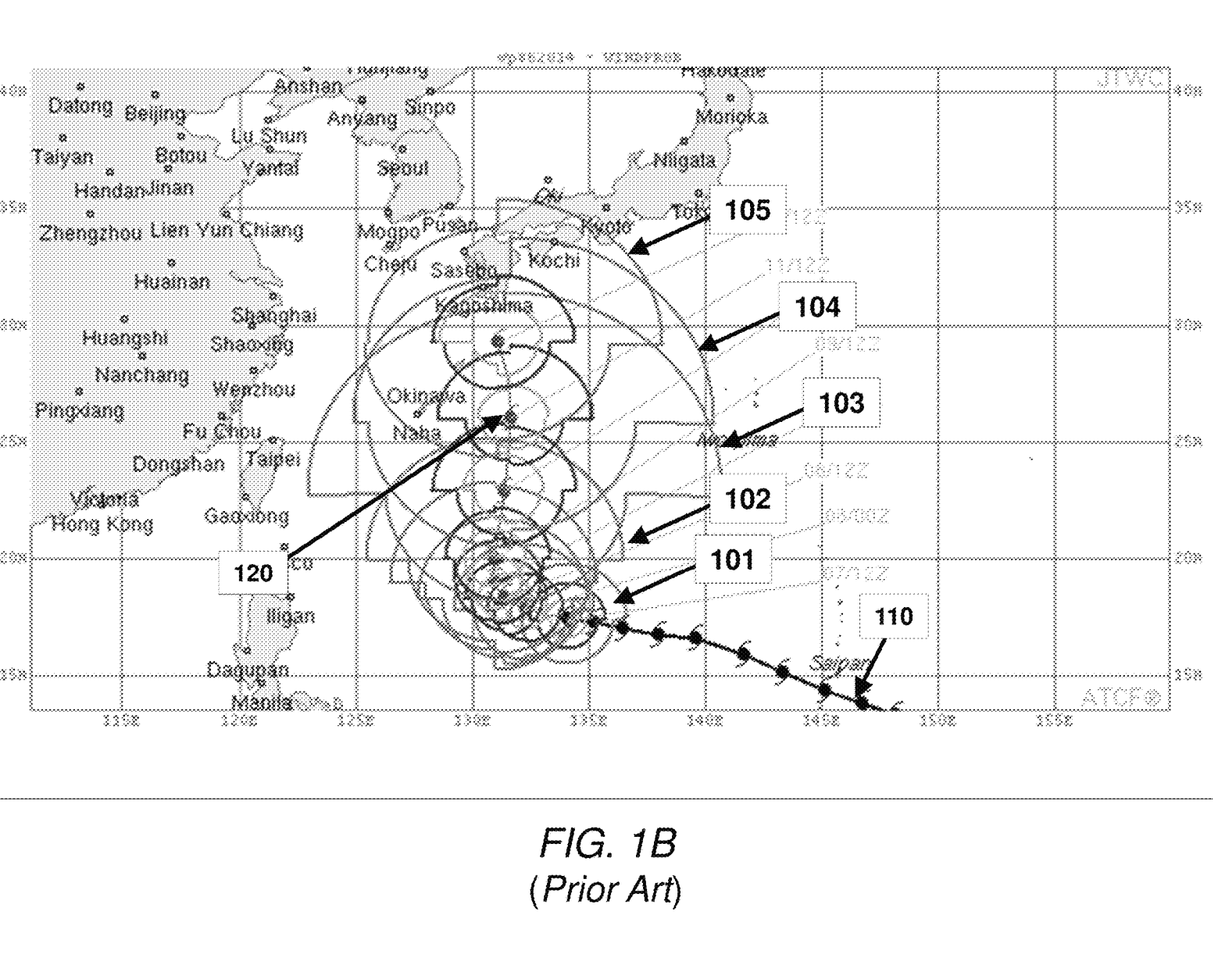

The results of these wind radii calculations and/or forecasts are typically shown in graphical form on plots such as those shown in FIGS. 1A and 1B.

FIG. 1A shows the results of a single exemplary wind radii analysis, and shows an exemplary wind radii plot 101, which includes a plot showing estimated wind radii 101a that contains TC winds 34 kt and above, 101b contains winds 50 kt and above, and 101c contains winds 64 kt and above. Each of these wind radii is further divided into the four geographic quadrants 102a-102d, showing the wind radii in each of those four quadrants. As can be seen in the FIG. 1A, the radii for winds at higher speeds (e.g., 50 kt radius 101a) are smaller than those for lower speed wind radii (e.g., 34 kt radius 101a). This is expected because TCs generally have highest speed winds near the center of the storm, and then the wind speeds generally decay with distance from its center.

FIG. 1B illustrates the results of an exemplary analysis and forecast of an intense TC with winds greater than 64 kt both at in the analysis and throughout a 5-day forecast. Such an analysis/forecast includes both an analysis of wind radii at a single analysis time shown by plot 101, plus the results of a forecast of the wind radii at 12, 24, 36, 48, 72, 96, and 120 hours in the future, shown by plots 102-105. The wind radii plots produced as part of the forecast process will often also include an historical track 110, showing where the TC has been and a forecast track 120, where the forecast wind radii follow a forecast track of the cyclone.

For a forecaster to define all of these wind radii for a single specified time (e.g., perform only a single analysis), the number of individual wind radii estimates required would be the number of wind speed thresholds times the number of wind radii quadrants (i.e., 3 wind speed thresholds×4 wind radii quadrants), or 12 individual wind radius estimates. If a forecaster were to estimate the wind radii for, e.g., 7 times in the future (e.g., the wind radii at 12, 24, 36, 48, 72, 96, and 120 hours in the future), in addition to making an estimate of the wind radii at the current time, the number of wind radius estimates required would become 3×4×8=96 individual wind radius estimates.

Doing each of these calculations individually rapidly becomes untenable, since the time allotted to a forecaster to complete the entire TC forecast, including performing other tasks such as communicating with customers and disseminating appropriate warnings to the affected sites, is generally less than 2 hours. In addition, some forecasters (e.g., the forecasters at the Joint Typhoon Warning Center) are required to generate forecasts—including wind radius forecasts—for more than one TC, which further increases the burden on the forecasters.

Consequently, there is a strong need for algorithms and convenience tools to facilitate and improve the performance of these tasks.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a computer-implemented system and methods that simplifies and improves the process for generating wind radii in tropical cyclones.

A computer-implemented system for generating tropical cyclone wind radii in accordance with the present invention can include a data receiver that receives data of the radius of TC winds at 34 kt, 50 kt, and 64 kt at each of four geographic quadrants, an OBTK processor configured to generate an analysis of the wind radii at the present time; and an RVCN processor configured to generate a forecast of the wind radii at one or more future forecast times. The system can also include a graphical representation generator configured to generate plots of the wind radii giving a forecaster an additional tool that can be used to make predictions regarding the track and strength of the TC.

The invention further provides a computer implemented method for making an analysis of wind radii data at a specified analysis time and for generating a forecast of wind radii at one or more times in the future.

A computer-implemented method for generating an analysis of wind radii in accordance with the present invention includes the steps of receiving data of wind radii for the analysis time, where the data can include observations of wind speeds and wind radii from satellites or other sensors and/or estimates of wind speeds and wind radii provided, e.g., by the U.S. National Weather Service or the U.S. Navy; computing the mean of non-zero wind radii estimates; combining this computed mean with the observed wind radii to obtain a single single wind radii analysis; and calculating a wind radius for each of the three threshold wind speeds (34 kt, 50 kt, and 64 kt) in each of four geographic quadrants.

A computer-implemented method for generating a forecast of wind radii in accordance with the present invention includes the steps of receiving data of wind radii for the analysis time; adjusting the estimates to the current time; adjusting the forecast estimates to align with observational data, the time frame at which to phase out these adjustments being predetermined by the forecaster; computing an unweighted mean of non-zero wind radii forecast estimates, generating a wind radius for each of the three threshold wind speeds (34 kt, 50 kt, and 64 kt) in each of four geographic quadrants for at least one future time period if data is received indicative of a determination by the forecaster that the TC is at or above a predetermined intensity threshold; and quality checking the calculated wind radii to ensure that the radii for higher wind speeds are less than the radii for lower wind speeds in the same quadrant.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides improvements to the Navy's Automated Tropical Cyclone Forecasting (ATCF®) system. The improvements described in the present disclosure will simplify and improve the process by which a computer utilized in the ATCF® system or elsewhere can generate wind radii analyses and forecasts from weather data from observational sources such as satellites, sensors, and scatterometers as well as from forecast agencies such as the JTWC, NHC, and CPHC. The system and methods for generating wind radii analyses and forecasts in accordance with the present invention provide improved computer-implemented definition and forecasts of wind radii in tropical storms, and enables the use of these wind radii forecasts by forecasters in much less time than is currently possible. The present invention further provides improvements to the methods for estimating these wind radii, which can dramatically reduce the human forecaster effort needed to perform such tasks, resulting in improved, more timely TC forecasts with fewer errors and less uncertainty.

The present invention also includes an improved graphical user interface that can enable a user to quickly and easily access the wind radii forecasts, assign multiple separate predictions of wind radii in the JTWC and other tropical cyclone forecasts. Using the system and method of the present invention, forecasters can better analyze, track, and predict the TC's path and its potential intensity.

The methods for wind radii analysis and forecasting in accordance with the present invention leverage algorithms that are based on "consensus forecasts" i.e., equally-weighted averages of non-zero forecasts of wind speed and the geographic areas to which those winds extend.

Wind radii analysis and forecasting are typically performed at a series of set times based on the coordinated universal time (UTC) system, and are currently performed at UTC 00:00, 06:00, 12:00, and 18:00. At each of these times, an analysis of the wind radii at that time is performed, based on observational data as well as modeled wind radii analyses and forecasts done at the previous analysis time. For example, a wind radii analysis and forecast performed at UTC 06:00 will be based on observational data obtained from satellites or other sensors near to the time of analysis, combined with the wind radii analysis made at UTC 00:00 and modeled wind radii forecasts made at UTC 00:00 for predicted wind radii at, e.g., 6, 12, 24, 36, 48, 72, 96, and 120 hours in the future. By using both observational data and modeled forecasts, the system and method of the present invention enables the computer-implemented generation of estimates of wind radii for all relevant threshold speeds in the relevant geographic quadrants which reflect both the best modeled forecasts and ground truth observations, improving the computer's functions of processing wind radii data and generating wind radii outputs by saving processing time and reducing errors in the wind radii forecast process.

Figure 2:
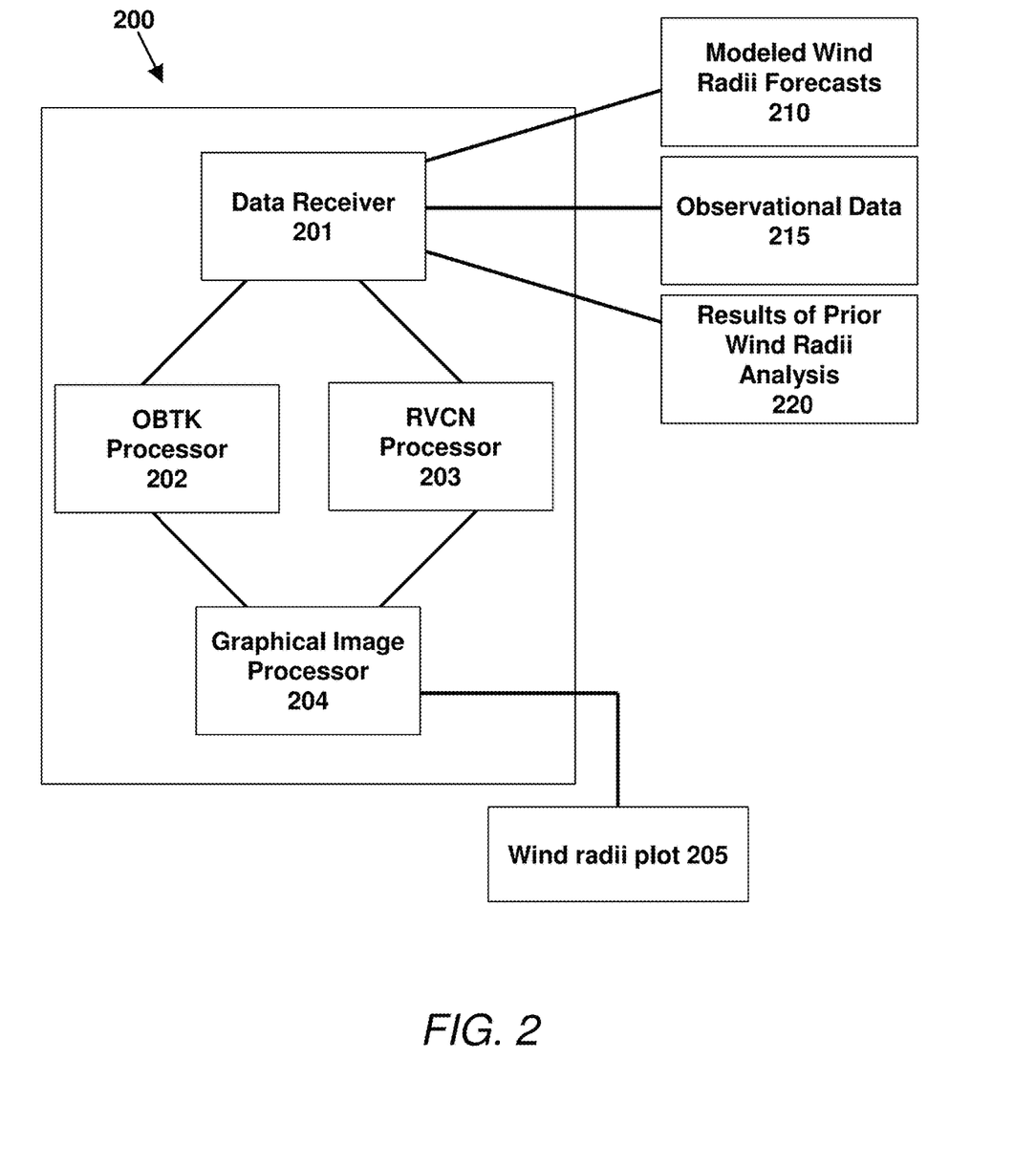
FIG. 2 is a block schematic illustrating aspects of a computer-implemented system for generating wind radii analyses and forecasts in accordance with one or more aspects of the present invention.

FIG. 2 is a schematic illustrating aspects of an exemplary system for generating wind radii analyses and forecasts in accordance with the present invention. As illustrated in FIG. 2 and as described in more detail below, a system 200 for generating wind radii analyses and forecasts can include a data receiver 201, an OBTK processor 20, an RVCN processor 203, and a graphical image processor 204.

Data receiver 201 receives wind radii data associated with a weather system such as a TC. The wind radii data can include modeled forecasts 210 of wind radii for each compass quadrant (NE, SE, SW, NE) at each wind speed threshold (e.g., 34 kt, 50 kt, and 64 kt) from a numerical weather prediction model, observational data 215 from a satellite source or other sensor such as a scatterometer known in the art, or results of a prior wind radii analysis 220 uploaded, e.g., to a wind radii database. Data can be delivered to data receiver 201 by any suitable mechanism, e.g., via a hard-wired connection or can be input by means of electronic communications from a remote site.

The received wind radii data is input into OBTK processor 202, which is configured to produce an analysis of the wind radii at a single predetermined time by means of the process steps described below with respect to FIG. 3. In current practice, the analysis is produced at UTC 00:00, 06:00, 12:00, and 18:00, though analysis can be performed at other times and at other time intervals as appropriate.

Typically, 3 to 20 modeled forecasts of the wind radii at each compass quadrant and each of the three threshold wind speeds will be received, though more or fewer forecasts and/or forecast wind radii at other wind speeds may also be used as appropriate. The observational data used will generally be the most current available, while the modeled forecast and wind radii analysis data used for the current analysis/forecast will have been generated at one or more previous analysis times; for example, for an analysis and forecast performed at UTC 06:00, data of modeled forecasts and wind radii analysis performed at UTC 00:00 will be used.

OBTK processor 202 includes a data quality checker configured to perform a quality check of the input data and the results of the wind radii analysis to ensure that they do not reflect a physical impossibility or any other anomaly. For example, it is physically impossible for a 50-kt wind to have a radius greater than that of a 34-kt wind in the same quadrant, and any data that reflects such physical impossibilities or other anomalies will be disregarded. In addition to other functions which may be employed as appropriate, OBTK processor 202 also is configured to compute the mean of non-zero wind radii values, to combine the modeled wind radii forecasts with high quality observational data considered to represent ground truth wind radii (e.g., wind radii data from scatterometer sensors known in the art), and to smooth transitions between the wind radii analysis obtained at a previous time and the wind radii obtained by the current analysis to ensure that those transitions and the current time are gradual.

The analysis can be used by RVCN processor 203 in generating a forecast as described below with respect to FIG. 4, or can be used by graphical image processor 204, which can transform the wind radii data into one or more wind radii plots 205 such as the plot shown in FIG. 1A. The wind radii analysis can also be used by a numerical weather prediction model or can be uploaded to a wind radii database for further processing in the future.

Thus, the system further includes RVCN processor 203, which is configured to generate forecasts of wind radii for at least one future forecast time by means of the process steps described below with respect to FIG. 4. In current practice, forecasts are generated at UTC 00:00, 06:00, 12:00, and 18:00, though such forecasts can be made at other times and/or at other time intervals as appropriate.

RVCN processor 203 is configured to receive wind radii data from data receiver 201; as with the data input to OBTK processor 202 described above, this data can include modeled forecasts 210 of wind radii for each compass quadrant (NE, SE, SW, NE) at each wind speed threshold (e.g., 34 kt, 50 kt, and 64 kt) from a numerical weather prediction model, observational data 220 from a satellite source or other sensor such as a scatterometer, or results of a prior wind radii analysis 220 uploaded, e.g., to a wind radii database.

As described in more detail below, In addition to other functions which may be employed as appropriate, RVCN processor 203 is configured to adjust the forecast time frames of the received modeled wind radii forecasts to a time frame based on the current analysis time, to adjust the modeled forecast wind radii as necessary to more closely align with wind radii data from observational sources such as scatterometers or other sensors, and to forecast the radius of winds at each of the three threshold wind speeds in each geographic quadrant for at least one future forecast time. As with the OBTK processor described above, RVCN processor 403 is configured to perform a quality check of the input and output wind radii data to ensure that it does not reflect a physical impossibility or other anomaly.

The data of the wind radii forecasts produced by RVCN processor 203 can then be input into a numerical weather prediction model for further use or processing or can be input into graphical processor 204 which can transform the wind radii data into one or more wind radii plots 205 such as the plot shown in FIG. 1B described above, to provide a visual representation of the wind radii and storm track.

The present invention also provides methods for generating wind radii analysis and forecasts to provide more accurate and timely tropical storm data and forecasts.

Figure 3:
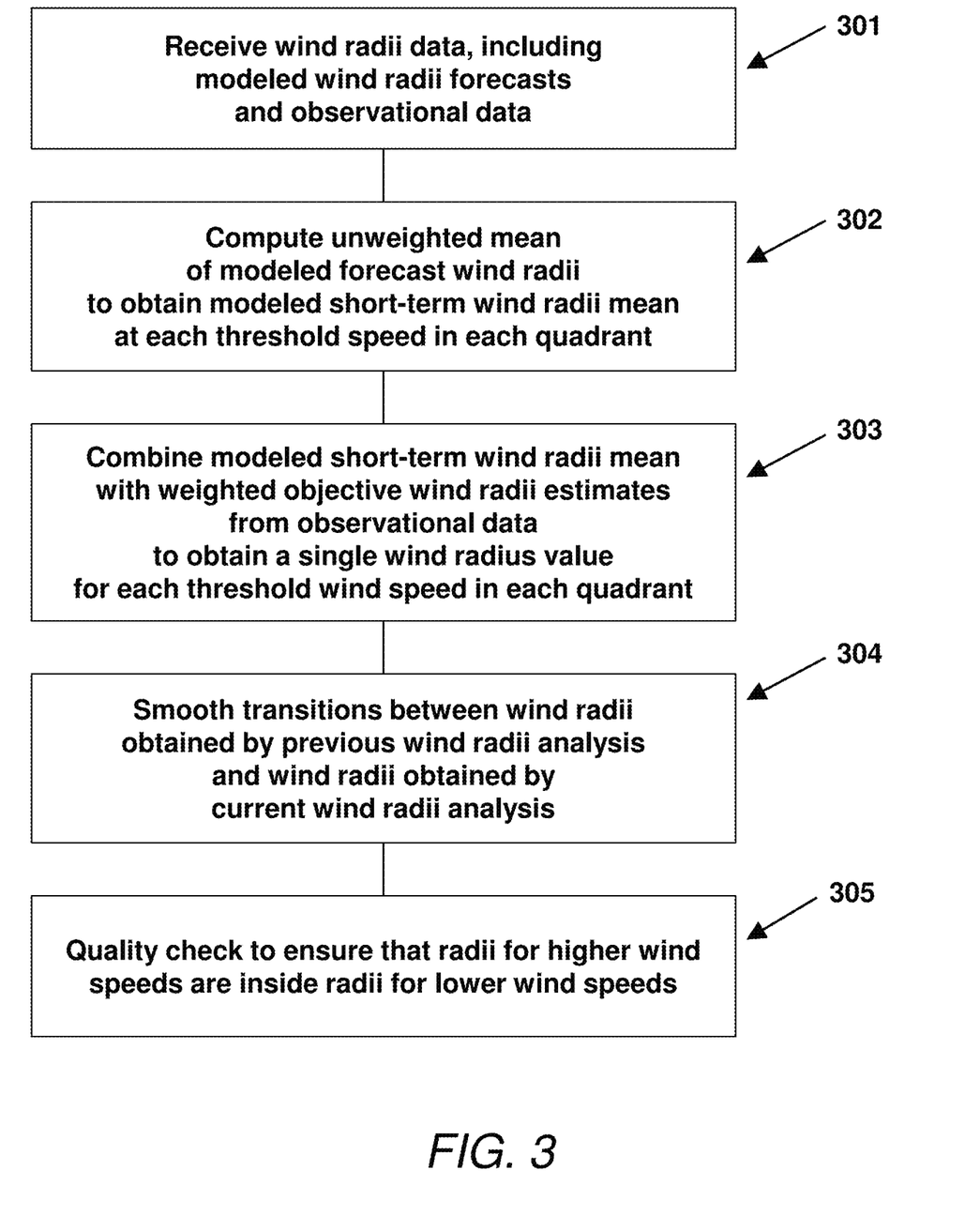
FIG. 3 is a flow chart illustrating exemplary process steps in a computer-implemented method for generating a wind radii analysis in accordance with one or more aspects of the present invention.

FIG. 3 is a flow chart illustrating exemplary process steps in a computer-implemented method for generating a wind radii analysis in accordance with the present invention, wherein a single wind radius value for each threshold wind speed in each geographic quadrant at one of a series of predetermined forecast times, e.g., one of UTC 00:00, 06:00, 12:00, and 18:00, is obtained by combining objective observational data with modeled wind radii values.

The resulting single wind radius values for each threshold wind speed in each geographic quadrant is referred to as the wind radii "analysis" or "OBTK."

The steps described below can be performed by a processor such as OBTK processor 202 described above with respect to FIG. 2. However, one skilled in the art will understand that other suitable hardware or software components can also be used as appropriate.

Thus, as illustrated in FIG. 3, the process starts at step 301, with the receipt by the processor of wind radii data as described above. The received data can include wind radii forecast estimates from numerical weather prediction models such as those from the U.S. National Weather Service or the U.S. Navy and observational data from a satellite source or other sensor such as a scatterometer, the observational data including the radius of winds having at least one threshold speed in at least one geographic quadrant, and can further include the results of a prior wind radii analysis. The wind radii data can be input into the processor by any suitable mechanism, e.g., via a hard-wired connection or by means of electronic communications from a remote site.

Typically the received data will include 3 to 20 modeled wind radii forecasts or observations of the wind radius for winds at each geographic quadrant (NE, SE, SW, NW) and each of the threshold wind speeds (e.g., 34 kt, 50 kt, and 64 kt), though more or fewer forecasts or data and/or forecasts or data regarding radii at other wind speeds may also be used as appropriate. The modeled forecasts will include predicted wind radii at each of at least one future forecast time, and typically will include predicted wind radii at multiple future forecast times, e.g., the wind radii predicted for 6, 12, 24, 48, 72, 96, and 120 hours in the future. Together with the objective observational data, these modeled future wind radii will be used to obtain a single wind radius value for each of the threshold wind speeds in each of the four geographic quadrants.

The modeled forecast and wind radii analysis data used for the current analysis/forecast will have been generated at one or more previous analysis times. For example, for an analysis and forecast performed at UTC 06:00, data of modeled forecasts and wind radii analysis performed at UTC 00:00 will be used. Using modeled forecasts of wind radii can be especially useful at times because such modeled forecasts can be made available in real time, whereas observations of actual wind speeds and wind radii generally are up to three hours late, i.e., are received up to three hours after their related events have occurred. Use of modeled wind radii forecasts is also important because such modeled wind radii help to stabilize the data used, especially when the tropical cyclone wind field is flat.

Quality checks of the data can be made at this or at any one or more of the steps described below to ensure that the data does not reflect a physical impossibility as described above or is otherwise unsuitable for use, e.g. does not have a larger wind radius for a 50-kt wind than a 34-kt wind in the same quadrant, with any data that reflects such physical impossibilities or other anomalies being disregarded for the next step(s).

In addition, a configurable time window can also be applied at this stage to ensure that only the data near the analysis time is processed. Preferably, the data used should reflect wind speed and wind radii at times within six hours of the time the analysis is performed such that e.g., only modeled wind radii forecasts going out to six hours in the future will be used, with values for forecasts farther out into the future being disregarded.

At the next step, shown in FIG. 3 as step 302, the non-zero wind radii for each threshold wind speed in each quadrant for the set of predetermined short-term forecasts are identified, and a mean of such non-zero wind radii forecasts is calculated to obtain a modeled short-term wind radius mean for each threshold wind speed in each quadrant. Because it is difficult to determine appropriate weights for forecast wind radii, in most embodiments, the calculated mean will be a simple, unweighted mean.

At step 303, the modeled short-term wind radii mean is combined with the observational data to obtain a single wind radius value for each of the threshold wind speeds in each quadrant. The observational data used in this step typically will be the observations obtained from scatterometer sensors since they are generally considered to be most closely representative of the actual ground truth winds and wind radii.

Thus, in accordance with the method of the present invention, at step 303, the modeled short-term wind radii mean is combined with the observational data by taking a mean of the modeled short-term wind radii, the satellite data analyzed wind radii, and the scatterometer data (considered ground truth and given additional weight in the mean) to obtain a single wind radius value for each threshold wind speed.

At step 304, using, e.g., a time filter, the transitions between the results of the previous analyses and the current analysis are smoothed to ensure that the changes between such analyses are gradual. This is important for operations because erratic changes in wind radius (e.g., a large radius at time 1, followed by a small radius at time 2, followed by another large radius at time 3) erode operational credibility.

Finally, at step 305, the wind radii calculated for the analysis can be subjected to a final quality check to ensure that they does not provide any physically impossible or otherwise anomalous results, e.g., show the radius for 34-kt winds as being inside the radius for 50-kt winds in the same quadrant.

The resulting wind radii analysis can then be output, e.g., into a numerical weather prediction model and/or a wind radii database for further processing, or can be input into a graphical image processor to produce one or more plots such as that shown in FIG. 1A, showing the radius of each of the three threshold winds in each of the four geographical quadrants.

As described above, the analysis provided by the process described above can also be used as part of a forecast of wind radii that can include an analysis of the wind radii at the analysis time plus a forecast of the wind radii at one or more future times.

Thus, the present invention also includes a computer-implemented method for generating a consensus (ensemble) wind radii track forecast such as that illustrated by the plots in FIG. 1B. In this aspect of the present invention, the computer generates wind radii calculations for at least one future forecast time, typically multiple future forecast times, so that forecasters can make predictions about the size, track, and estimated time frame of the tropical storm.

Figure 4:
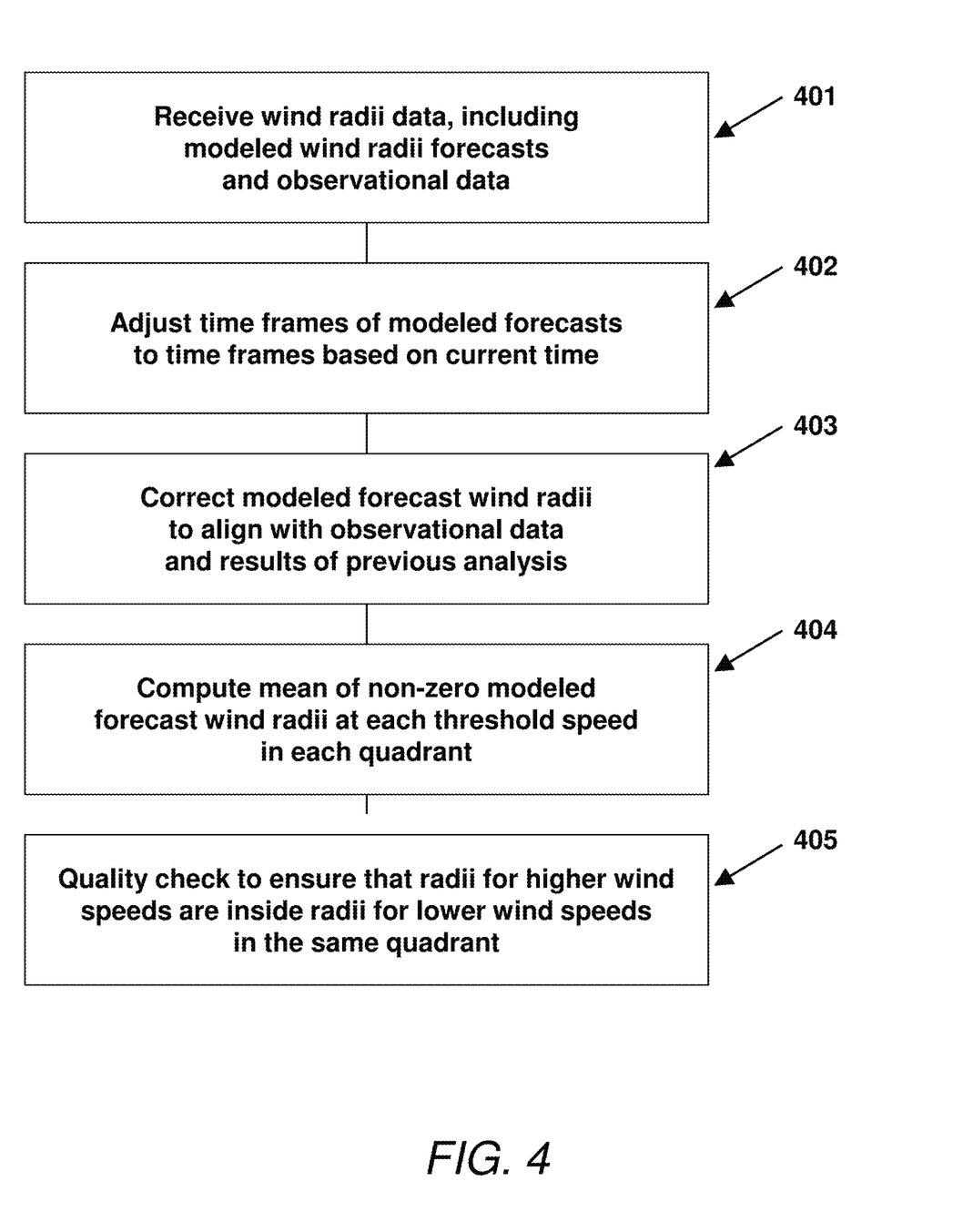
FIG. 4 is a flow chart illustrating exemplary process steps in a computer-implemented method for generating a consensus forecast of wind radii tracks in accordance with one or more aspects of the present invention.

Exemplary process steps in a computer-implemented method for generating wind radii track forecast are illustrated by the flow chart in FIG. 4.

The steps described below are performed by a processor such as RVCN processor 203 described above with respect to FIG. 2. However, one skilled in the art will understand that other suitable hardware or software components can be used as appropriate.

Thus, as illustrated in FIG. 4, at a first step 401, the process starts with the receipt by the processor of wind radii data as described above with respect to the analysis generation process. The data can be input into the processor by any suitable mechanism, e.g., via a hard-wired connection or by means of electronic communications from a remote site. The input data can include wind radii forecast estimates from numerical weather prediction models such as those from the U.S. National Weather Service or the U.S. Navy, observational data from a satellite source or other sensor such as a scatterometer, and results of a wind radii analysis generated as described above with respect to FIG. 3.

As with the analysis described above, the data received typically will include 3 to 20 modeled wind radii forecasts or observations of the wind radius for winds at each geographic quadrant (NE, SE, SW, NW) and each of the threshold wind speeds (e.g., at 34 kt, 50 kt, and 64 kt), though more or fewer forecasts or data and/or forecasts or data regarding radii at other wind speeds may also be used as appropriate. The modeled forecasts will include predicted wind radii at each of at least one future forecast time, and typically will include predicted wind radii at multiple future forecast times, e.g., predicted wind radii at 6, 12, 24, 48, 72, 96, and 120 hours in the future.

Forecasts can be made at one of a series of predetermined times, e.g., at UTC 00:00, 06:00, 12:00, and 18:00 in current practice, with the modeled forecast and wind radii analysis data used for the current forecast having been generated at one or more previous analysis times. For example, for a forecast made at UTC 06:00, data of modeled forecasts and wind radii analysis made at UTC 00:00 will be used.

Quality checks of the data can be made at this or at any one or more of the steps described below to ensure that the data does not reflect a physical impossibility as described above or is otherwise unsuitable for use, e.g. does not have a larger wind radius for a 50-kt wind than a 34-kt wind in the same quadrant, with any data that reflects such physical impossibilities or other anomalies being disregarded for the next step(s).

To account for this time delay, at step 402, the time frame associated with each of the forecasts in the modeled forecasts is adjusted to reflect the current time. For example, for a forecast made at time UTC 06:00, a forecast done at UTC 00:00 that predicted the wind radii 6 hours in the future ("6-h forecast") is treated as the current-time analysis. The times of all other forecasts are similarly adjusted, e.g., a 12-hour forecast is treated as being a 6-hour forecast, an 18-hour forecast is treated as being a 12-hour forecast, etc.

At step 403, the modeled forecast wind radii at the 6-hour forecast are revised so as to more accurately reflect ground truth wind radii data received, e.g., from satellite or other sensor sources such as a scatterometer. The wind radii for forecasts farther out in the future may also be adjusted to reflect the ground truth observations. For example, a six-hour old forecast model may have a six-hour wind radius forecast of 300 km for 34-kt winds in the NE quadrant, while the observational data shows an actual radius of 200 km. In such a case, the modeled wind radius will be adjusted to be 300 km, with other radii also being adjusted to align with this or other observations.

The time frame for which this adjustment is to be made can be user-determined, i.e., the forecaster may determine that the modeled forecast wind radii should be adjusted for forecast wind radii out to the 12-hour forecast and then be phased out for wind radii forecasts for time periods farther out in the future. The time frames for which such an adjustment is made and the time frames for which such an adjustment is phased out will typically be predetermined by the forecaster at or before the time of the current forecast run, with data indicative of such time frames being input into the RVCN processor, e.g., by means of an entry made using a graphical user interface such as that described below with respect to FIGS. 5A and 5B. In addition, the time frames for which the adjustment is made and for which the adjustment is phased out may vary from one forecast model to another since some forecast models may be known to the forecaster to be more accurate than others.

At step 404, the mean of the non-zero modeled forecast wind radii in each geographic quadrant at each forecast period (the times and the modeled wind radii having been adjusted as described above) is calculated and a wind radius for each threshold wind speed in each geographic quadrant for each of at least one future forecast time is assigned. Because it is difficult to determine appropriate weights for forecast wind radii and weighting values has not been shown to consistently improve results, this calculated mean usually will be a simple, unweighted mean. In addition, because only winds for intense TCs are of interest to the forecaster, the processor assigns radii for these winds only upon receipt of data indicative of a conclusion by the forecaster that the TC is at or above a predetermined intensity threshold.

Finally, at step 405, an additional quality control analysis can be performed on the unweighted mean to ensure that none of the forecast wind radii are physically impossible, e.g., to ensure that the radius for the 50-kt wind is not greater than that of the 34-kt wind in the same quadrant.

Once the wind radii are computed and a forecast of the wind radii for the various future forecast times is made, data of this forecast can be output, e.g., into a numerical weather prediction model for use in producing an historical track of the storm and in predicting a future track. The forecast data can also be input into a graphical image processor to produce one or more plots such as that shown in FIG. 1B, showing the radius of each of the three threshold winds in each of the four geographical quadrants for each of a plurality of forecast times, as well as an historical track and a future track.

In other aspects, the present invention also provides an improved user interface for forecasting software which can allow a forecaster to obtain wind radii calculations for a specified forecast time with a single click, where the convenience button assigns all the wind radius values for wind speeds in each geographic quadrant at once, using the wind radii forecasts obtained using the computer-implemented methodology described above.

In practice, the forecaster typically will make a TC intensity forecast based on based on data other than wind radii, such as data from aircraft and satellite sources, data from weather reconnaissance devices such as dropsondes, and pattern recognition by human forecasters, and the method of the present invention will assign wind radii that adhere to given rules of a given forecast. For example, if a wind speed is less than the lowest threshold wind speed for a wind radius, i.e., is less than 35 kt for the 34-kt wind radii, the the 34-kt wind radii will be set to zero. If instead the TC intensity forecast is for wind speeds greater than 34 kt, then our algorithm assigns wind radii values by means of the computer-implemented process described above.

Figure 5A:
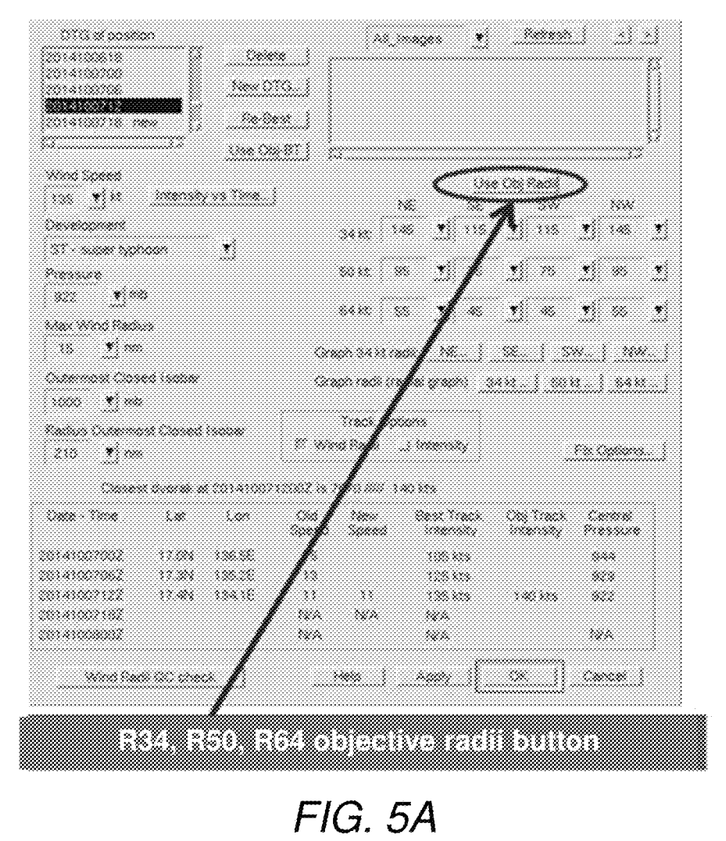
FIGS. 5A and 5B are screen shots illustrating aspects of a user interface for accessing a computer-implemented method for generating wind radii analyses and forecasts in accordance with one or more aspects of the present invention.
Figure 5B:
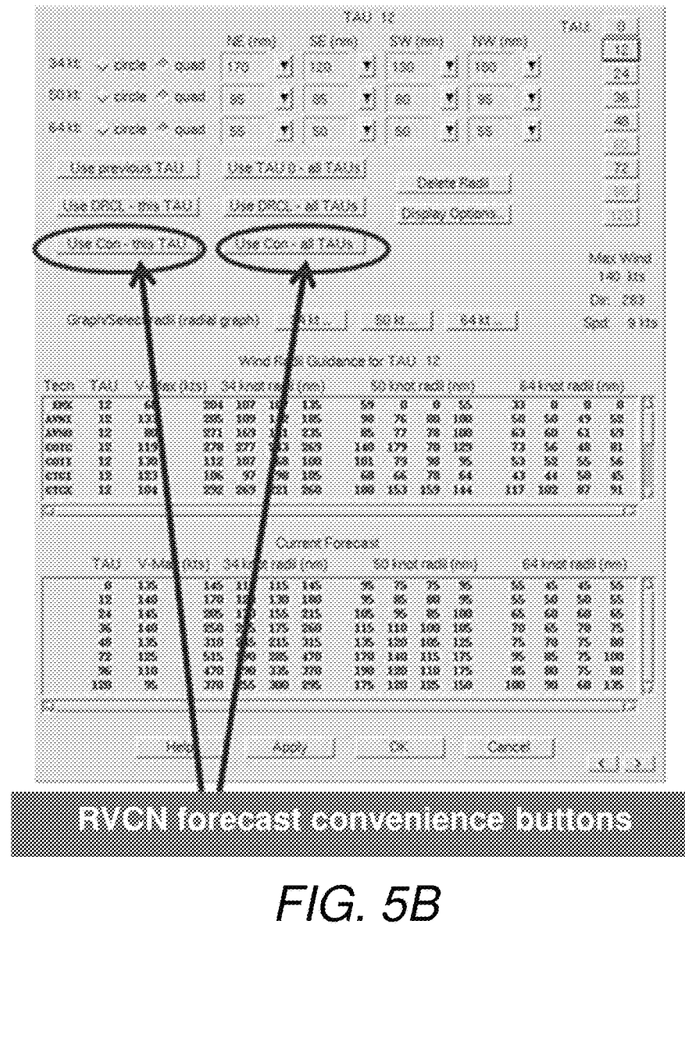

FIGS. 5A and 5B illustrate exemplary configurations of convenience buttons in an improved ATCF® user interface in accordance with the present invention.

Pressing the "Use Obj Radii" in FIG. 5A assigns values to each entity of the table immediately under the button. The assignment is for three wind speed thresholds (34 kt, 50 kt, and 64 kt) and four compass quadrants (NE, SE, SW, NW) in an intense TC. The assignments for each threshold only occur if the TC intensity (wind speed near the center) is above the wind speed threshold.

Pressing "Use Con—this TAU" button in FIG. 5B values to the table at the top of the dialog. The assignment is for three wind speed thresholds (34 kt, 50 kt, and 64 kt) and four compass quadrants (NE, SE, SW, NW) in an intense TC. The assignments for each threshold only occur if the TC intensity (wind speed near the center) is above the wind speed threshold.

Pressing "Use Con—all TAUs" button in FIG. 5B values to the table at the top of the dialog and for all "TAUs" or forecast lengths. The assignment is for three wind speed thresholds (34 kt, 50 kt, and 64 kt) and four compass quadrants (NE, SE, SW, NW) in an intense TC. The assignments for each threshold only occur if the TC intensity (wind speed near the center) is above the wind speed threshold at each forecast time.

The convenience buttons can be configured so as to provide wind radii forecasts for a single forecast period, e.g., for a 24-hour forecast, or for the entire length of the forecast, which currently could be as many as seven distinct forecast periods (12, 24, 36, 48, 72, 96, and 120 h).

In other embodiments, the computer can be programmed with pre-assigned threshold values so that the entire process can be automated without the need for user action.

Advantages and New Features

A key innovation of our invention is the automated generation of higher quality wind radii forecasts than were previously available, and those can enable higher quality TC wind, wave and surge forecasts important to the U.S. Navy and the general public.

Figure 6A:
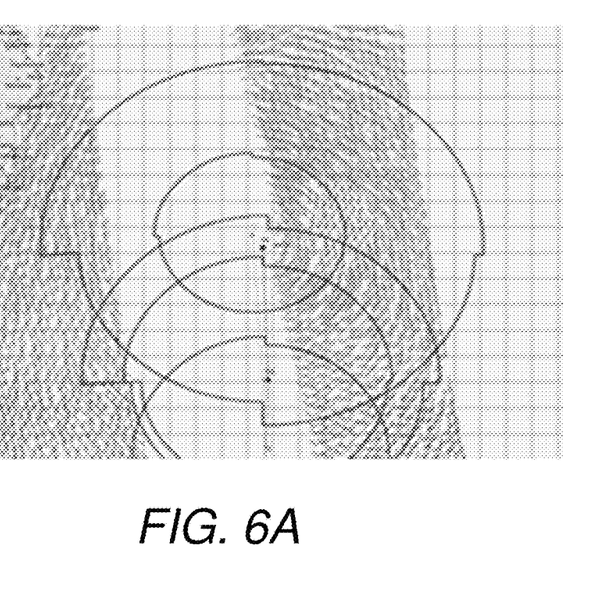
FIGS. 6A and 6B are plots illustrating how the improved wind radii forecast analyses and forecasts obtained using the method of the present invention more closely correspond to observed wind data than do wind radii forecasts obtained by the prior art.
Figure 6B:
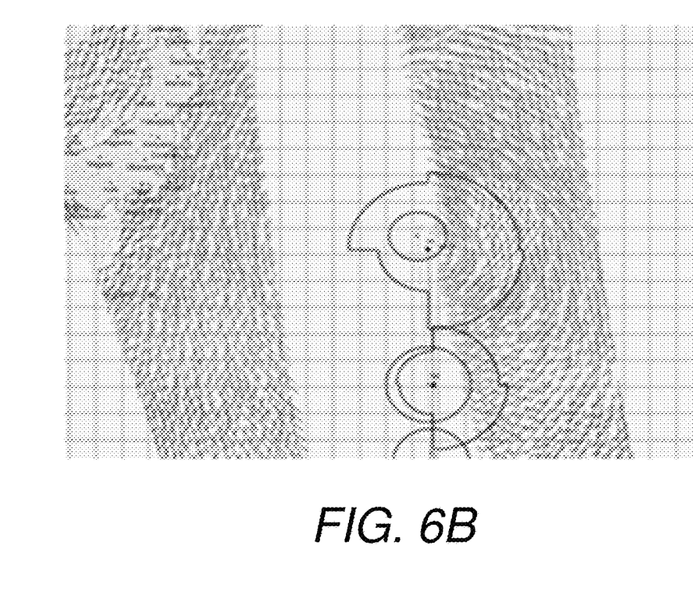

The plots in FIGS. 6A and 6B illustrate the improvement provided by the methods of the present invention over currently available wind radii forecasts. In the case illustrated in FIG. 6A, the 0-, 12-, and 24-h forecasts of 34-kt wind radii (shown as the outer radii in each of forecasts) produced using the methodology of the present invention are overlaid on the wind radii produced by a forecaster at JTWC using prior art methods (shown by the inner radii), while FIG. 6B is a plot of 50-kt forecast wind radii in accordance with the present invention (outer radii) overlaid on forecast wind radii produced by the prior art JTWC methods (inner radii). In both FIGURES, the satellite (observed) wind speeds are represented by the wind vectors shown in swaths across the FIGURES. The red wind vectors indicate wind speeds greater than 34 kt and wind vectors with a single pennant indicate wind speeds greater than 50 kt. As can be seen in both FIGURES, the radii produced in accordance with the present invention more closely matched the satellite (observed) wind speeds illustrated by the wind vectors in the FIGURES.

The JTWC 24-h forecasts of 34-kt wind radii based on prior art were inside an area of satellite (observed) 50-kt winds, grossly underestimating the spatial extent of the 34-kt winds. Such an error are detrimental to military operations such as U.S. Navy ship traffic in the area since ship routers are expected to route the ships around these high winds, which are also well-correlated with high seas.

Another advantage provided by the present invention is that the forecasts for both the wind radii analysis and wind radii forecasts obtained in accordance with the present invention are configurable so that the specific algorithms used for the forecasts can be changed if algorithms with higher quality forecasts become available.

In addition, the wind radii forecasts produced in accordance with the method of the present invention are passed through a quality control filter before being used to generate the wind radii plots to ensure that the results are within climatological restraints (e.g., the wind radii cannot have negative values) and physical restraints (e.g., the 34-kt wind radii cannot be smaller than the 50-kt wind radii).

Thus, the system and methods for generating wind radii forecasts in accordance with the present invention provide improved computer-implemented definition and forecasts of wind radii in tropical storms, and enables the viewing of these wind radii for forecasters in real-time. The present invention further provides improvements to the assignment of these wind radii, which can dramatically reduce the forecaster effort to perform the task in operations with no degradation and possibly improvement in quality.

These and other features of the present invention provide improvements to the computer's functions of processing wind radii data and generating wind radii outputs by saving processing time and reducing errors in the wind radii forecast process.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A computer-implemented method for generating a consensus wind radii track forecast of wind radii in a tropical cyclone, comprising the steps of:

receiving, at a data receiver, modeled wind radii data from at least one numerical weather prediction model, the modeled wind radii data including a plurality of modeled wind radii indicating a spatial radius of a wind having a speed at or above one of a plurality of predetermined threshold wind speeds in at least one of four predetermined geographic quadrants, the modeled wind radii data further including at least one predicted wind radius in the at least one of the geographic quadrants for at least one future time period; receiving, at the data receiver, observational wind radii data of at least one observed wind radius in the at least one of the geographic quadrants from a satellite source or other sensor;

inputting the modeled wind radii data and the observational wind radii data into a processor configured to generate a forecast of the wind radii at one or more future forecast times;

analyzing the modeled wind radii data to identify undesired data reflecting a physical impossibility or other anomaly and eliminating the undesired data from the data to be processed;

adjusting a time frame for each of the modeled wind radii forecasts to reflect a time at which the prediction is being made;

for each threshold wind speed in each geographic quadrant, generating a set of adjusted wind radii forecasts by correcting at least one predicted wind radius in at least one future modeled forecast to conform to the received observational data of wind radius at that wind speed, corrections being made to wind radii predicted in future forecast periods up to a predetermined future time and not being made to wind radii predicted in future forecast periods after the predetermined future time;

for each threshold wind speed and for each of a plurality of future forecast periods up to the predetermined future time, calculating a mean of the adjusted wind radii in each of the adjusted wind radii forecasts in each geographic quadrant to generate a consensus wind radii track forecast comprising a predicted wind radius for each threshold wind speed at each future forecast period in each geographic quadrant, wherein the consensus wind radii track forecast reflects the adjustment of the modeled wind radii based on the observations of actual wind radii at the threshold wind speed in the geographic quadrant and forecasts at least one of a size, a track, and/or an estimated time frame of the tropical cyclone for at least one future forecast period;

outputting the consensus wind radii track forecast to a graphical image processor; and using the graphical image processor, generating a visual image of the consensus wind radii track forecast at each future forecast period in each geographic quadrant;

wherein the visual image indicates at least one of a size, a track, and/or an estimated time frame of the tropical cyclone for at least one future forecast period.

2. A computer-implemented method for generating a map of forecast wind radii in a tropical cyclone, comprising the steps of:

receiving modeled wind radii data from at least one numerical weather prediction model, the modeled wind radii data including a plurality of modeled wind radii indicating a spatial radius of a wind having a speed at or above one of a plurality of predetermined threshold wind speeds in at least one of four predetermined geographic quadrants, the modeled wind radii data further including at least one predicted wind radius in the at least one of the geographic quadrants for at least one future time period; receiving observational wind radii data of at least one observed wind radius in the at least one of the geographic quadrants from a satellite source or other sensor;

analyzing the modeled wind radii data to identify undesired data reflecting a physical impossibility or other anomaly and eliminating the undesired data from the data to be processed;

adjusting a time frame for each of the predicted wind radii reflect a time at which the prediction is being made;

for each threshold wind speed in each geographic quadrant, generating a set of adjusted wind radii forecasts by correcting at least one predicted wind radius in at least one future modeled forecast to conform to the received observational data of wind radius at that wind speed, corrections being made to wind radii predicted in future forecast periods up to a predetermined future time and not being made to wind radii predicted in future forecast periods after the predetermined future time;

for each threshold wind speed in each geographic quadrant, calculating a mean of the adjusted wind radii for each of a plurality of future forecast periods up to the predetermined future time to generate a consensus wind radii track forecast comprising a predicted wind radius for each threshold wind speed at each future forecast period in each geographic quadrant, the consensus wind radii track forecast reflecting both the data of the modeled wind radii and the observations of actual wind radii at the threshold wind speed in the geographic quadrant and providing information regarding a size, a track, and/or an estimated time frame of the tropical cyclone for at least one future forecast period; and outputting the consensus wind radii track forecast to a graphical image processor; and using the graphical image processor, generating a map showing the predicted wind radius for each threshold wind speed at each future forecast period in each geographic quadrant.

3. The method according to claim 2, further comprising generating a map showing at least one of a historical track and a future track of the wind radius for each threshold wind speed in each geographic quadrant.

* * * * *